(12) United States Patent
Harutyunyan

(10) Patent No.: US 8,541,054 B2
(45) Date of Patent: Sep. 24, 2013

(54) METHODS FOR PREPARATION OF ONE-DIMENSIONAL CARBON NANOSTRUCTURES

(75) Inventor: Avetik Harutyunyan, Columbus, OH (US)

(73) Assignee: Honda Motor Co., Ltd, Tokyo (JP)

( * ) Notice: Subject to any disclaimer, the term of this patent is extended or adjusted under 35 U.S.C. 154(b) by 658 days.

(21) Appl. No.: 10/658,711

(22) Filed: Sep. 8, 2003

(65) Prior Publication Data
US 2005/0053542 A1    Mar. 10, 2005

(51) Int. Cl.
*C23C 16/00*    (2006.01)

(52) U.S. Cl.
USPC ............... 427/249.1; 427/248.1; 427/249.4; 427/250; 427/255.23

(58) Field of Classification Search
USPC ............ 427/248.1, 249.4, 255.23, 249.1, 427/250
See application file for complete search history.

(56) References Cited

U.S. PATENT DOCUMENTS

| 4,650,895 | A * | 3/1987 | Kadokura et al. ............ 556/182 |
| 5,863,601 | A * | 1/1999 | Kikuchi et al. ................ 427/200 |
| 5,872,422 | A * | 2/1999 | Xu et al. ....................... 313/311 |
| 6,062,931 | A | 5/2000 | Chuang et al. |
| 6,221,330 | B1 | 4/2001 | Moy et al. |
| 6,232,706 | B1 * | 5/2001 | Dai et al. ....................... 313/309 |
| 6,287,918 | B1 | 9/2001 | Xiang et al. |
| 6,448,701 | B1 | 9/2002 | Hsu |
| 6,583,085 | B1 | 6/2003 | Nakayama et al. |
| 6,692,717 | B1 * | 2/2004 | Smalley et al. ............ 423/445 B |
| 7,033,647 | B2 * | 4/2006 | Tang et al. .................... 427/533 |
| 2002/0024279 | A1 | 2/2002 | Simpson et al. |
| 2002/0036452 | A1 * | 3/2002 | Muroyama et al. ........... 313/310 |
| 2002/0054849 | A1 | 5/2002 | Baker et al. |
| 2002/0160111 | A1 * | 10/2002 | Sun et al. ................... 427/248.1 |
| 2002/0167374 | A1 | 11/2002 | Hunt et al. |
| 2003/0124717 | A1 | 7/2003 | Awano et al. |

FOREIGN PATENT DOCUMENTS

| EP | 1 601 041 A1 | 12/2000 |
| JP | 11-011917 | 1/1999 |
| JP | 2001-262343 A | 9/2001 |
| JP | 2002-542136 A | 12/2002 |
| JP | 2003-500324 A | 1/2003 |
| WO | WO 00/63115 A1 | 10/2000 |

OTHER PUBLICATIONS

PCT International Search Report and Written Opinion; PCT/US04/28961, Oct. 17, 2005, 10 pages.
Japanese Patent Office, Office Action, Japanese Patent Application No. JP 2006-525501, May 18, 2010, eleven pages.
Japanese Patent Office, Office Action, Japanese Patent Application No. JP 2006-525501, Feb. 8, 2011, eight pages.
Japanese Patent Office, Office Action, Japanese Patent Application No. 2011-087795, May 15, 2013, five pages.

* cited by examiner

*Primary Examiner* — Elizabeth Burkhart
(74) *Attorney, Agent, or Firm* — Fenwick & West LLP; Mark Duell

(57) ABSTRACT

A method for synthesizing carbon nanostructures is provided. A metalorganic layer is deposited on a substrate that has a deposition mask. The mask is removed, which also removes the portion of the metalorganic precursor deposited on the mask. The remaining portions of the metal organic layer are oxidized to produce a metal growth catalyst on the substrate that can be used for synthesis of carbon nanostructures.

14 Claims, 5 Drawing Sheets

METHODS FOR PREPARATION OF ONE-DIMENSIONAL CARBON NANOSTRUCTURES

FIELD OF INVENTION

The present invention relates to methods for the preparation of carbon nanotubes and carbon nanostructures using chemical vapor deposition.

BACKGROUND

Carbon nanotubes are hexagonal networks of carbon atoms forming seamless tubes with each end capped with half of a fullerene molecule. They were first reported in 1991 by Sumio Iijima who produced multi-layer concentric tubes or multi-walled carbon nanotubes by evaporating carbon in an arc discharge. They reported carbon nanotubes having up to seven walls. In 1993, Iijima's group and an IBM team headed by Donald Bethune independently discovered that a single-wall nanotube could be made by vaporizing carbon together with a transition metal such as iron or cobalt in an arc generator (see Iijima et al. Nature 363:603 (1993); Bethune et al., Nature 363: 605 (1993) and U.S. Pat. No. 5,424,054). The original syntheses produced low yields of non-uniform nanotubes mixed with large amounts of soot and metal particles.

Presently, there are three main approaches for the synthesis of single- and multi-walled carbon nanotubes. These include the electric arc discharge of graphite rod (Journet et al. Nature 388: 756 (1997)), the laser ablation of carbon (Thess et al. Science 273: 483 (1996)), and the chemical vapor deposition of hydrocarbons (Ivanov et al. Chem. Phys. Lett 223: 329 (1994); Li et al. Science 274: 1701 (1996)). Multi-walled carbon nanotubes can be produced on a commercial scale by catalytic hydrocarbon cracking while single-walled carbon nanotubes are still produced on a gram scale by laser techniques.

Generally, single-walled carbon nanotubes are preferred over multi-walled carbon nanotubes because they have fewer defects and are therefore stronger and more conductive than multi-walled carbon nanotubes of similar diameter. Defects are less likely to occur in single-walled carbon nanotubes because multi-walled carbon nanotubes can survive occasional defects by forming bridges between unsaturated carbon valances, while single-walled carbon nanotubes have no neighboring walls to compensate for defects. Defect-free single-walled nanotubes are expected to have remarkable mechanical, electronic and magnetic properties that could be tunable by varying the diameter, number of concentric shells, and chirality of the tube.

Single-walled carbon nanotubes have been produced by simultaneously evaporating carbon and a small percentage of Group VIII transition metal from the anode of the arc discharge apparatus (Saito et al. Chem. Phys. Lett. 236: 419 (1995)). Further, the use of mixtures of transition metals has been shown to increase the yield of single-walled carbon nanotubes in the arc discharge apparatus. However, the yield of nanotubes is still low, the nanotubes can exhibit significant variations in structure and size between individual tubes in the mixture, and the nanotubes can be difficult to separate from the other reaction products. In a typical arc discharge process, a carbon anode loaded with catalyst material (typically a combination of metals such as nickel/cobalt, nickel/cobalt/iron, or nickel and transition element such as yttrium) is consumed in arc plasma. The catalyst and the carbon are vaporized and the single-walled carbon nanotubes are grown by the condensation of carbon onto the condensed liquid catalyst. Sulfur compounds such as iron sulfide, sulfur or hydrogen sulfides are typically used as catalyst promoter to maximize the yield of the product.

A typical laser ablation process for producing single-walled carbon nanotubes is disclosed by Andreas Thess et al. (1996). Metal catalyst particle such as nickel-cobalt alloy is mixed with graphite powder at a predetermined percentage, and the mixture is pressed to obtain a pellet. A laser beam is radiated to the pellet. The laser beam evaporates the carbon and the nickel-cobalt alloy, and the carbon vapor is condensed in the presence of the metal catalyst. Single-wall carbon nanotubes that do not have constant diameters are found in the condensation. However, the addition of a second laser to their process which give a pulse 50 nanoseconds after the pulse of the first laser favored the 10, 10 configuration (a chain of 10 hexagons around the circumference of the nanotube). The product consisted of fibers approximately 10 to 20 nm in diameter and many micrometers long comprising randomly oriented single-wall nanotubes, each nanotube having a diameter of about 1.38 nm.

Unlike the laser and arc techniques, carbon vapor deposition over transition metal catalysts tends to create multi-walled carbon nanotubes as the main product instead of single-walled carbon nanotubes. However, there has been some success in producing predominantly single-walled carbon nanotubes from the catalytic hydrocarbon cracking process. Dai et al. (Chem. Phys. Lett 260: 471 (1996)) demonstrate web-like single-walled carbon nanotubes resulting from disproportionation of carbon monoxide (CO) with a molybdenum (Mo) catalyst supported on alumina heated to 1200° C. The diameter of the single-walled carbon nanotubes generally varies from 1 nm to 5 nm and could be controlled by the Mo particle size. The electron microscope images of the product shows the Mo metal attached to nanotubes at their tips. Rope-like bundles of single-walled carbon nanotubes have been generated from the thermal cracking of benzene with iron catalyst and sulfur additive at temperatures between 1100-1200° C. The synthesized single-walled carbon nanotubes are roughly aligned in bundles and woven together similarly to those obtained from laser vaporization or electric arc method. The use of metal catalysts comprising iron and at least one element chosen from Group V (V, Nb and Ta), VI (Cr, Mo and W), VII (Mn, Tc and Re) or the lanthamides has also been proposed (U.S. Pat. No. 5,707,916).

The presently available methods of synthesizing carbon nanotubes produce bulk amounts of carbon nanotubes that are generally tangled and kinked. Further, the nanotubes can have molecular level structural defects that can adversely impact their properties. Thus, the existing methods cannot fabricate a carbon nanotube at a pre-selected location. For example, one potential application of carbon nanotubes is as interconnect wiring within a circuit. U.S. Pat. No. 6,574,130 discloses a hybrid memory cell in which each cell has a nanotube ribbon crossbar junction. The nanotube ribbon is formed separately from a matted or tangled nanotube, and then placed at the desired location on the memory cell. This process could be simplified if methods for efficiently producing individual carbon nanotubes at discrete locations were available.

A method for manufacturing carbon nanotubes as elements of microelectromechanical manufacturing systems (MEMS) devices is disclosed in U.S. Pat. No. 6,146,227. A nanosize hole or nanoscale catalyst retaining structure is fabricated in the layer on the MEMS substrate into which a nanotube growth catalyst is deposited. A nanotube is then grown within the nanosize hole. The method thus controls the location and size of the nanotubes by placing a nanoscale catalyst retaining structure at a specific location on the MEMS substrate.

In the method of U.S. Pat. No. 6,401,526, the location of the nanotubes is determined by the placement of silicon pyramids. The silicon pyramids are placed at specific location, dip coated with a liquid phase catalyst, followed by chemical vapor deposition of carbon to make single-walled carbon nanotube probe-tips for atomic force microscopy. The nanotubes are then shortened to the desired length.

Thus, there is a need for methods for synthesizing individual carbon nanotubes at preselected location on a substrate. Preferably, the method allows for growth of a controlled number of carbon nanotubes at preselected locations on a substrate. In additon, the method also preferably allows for the growth of individual carbon nanotubes of a desired type, such as single-wall nanotubes.

SUMMARY

The present invention provides methods and processes for growing carbon nanotubes in targeted locations on a substrate. In one aspect, a masking layer is placed on a substrate that leaves selected portions of the substrate exposed. A metalorganic precursor film is then deposited on the substrate. The precursor film is deposited on both the masked and exposed portions of the substrate using a dry technique. After depositing the precursor film, the masking layer is removed from the substrate. The metalorganic film remaining on the substrate is then pyrolyzed to form metal nanoparticles. The resulting metal nanoparticles are used as a growth catalyst for the growth of carbon nanotubes.

In one aspect, the invention provides methods for synthesizing carbon nanostructures. The methods involve providing a substrate having a deposition mask, depositing a metalorganic layer on the substrate wherein at least a portion of the metalorganic layer is deposited on an unmasked portion of the substrate, removing the deposition mask from the substrate, oxidizing the portion of the metalorganic layer deposited on an unmasked portion of the substrate to form a growth catalyst on the substrate, and exposing the substrate to a carbon precursor gas at a deposition temperature to form carbon nanostructures. The deposition mask can be a metal oxide, such as silicon oxide or aluminum oxide. The metalorganic layer can be composed or iron phthalocyanine, molybedum phthalocyanine, or combinations thereof, and the carbon precursor gas can be methane that can additionally contain other gases such as argon and hydrogen.

In another aspect, the invention provides a system for producing carbon nanotubes. The system comprises a reactor capable of supporting a plurality of temperature zones and having an air-tight chamber where a source of carbon precursor gas and a source of inert gases is provided; a sample holder placed within a first temperature zone; a masked substrate place within a second temperature zone; and an evacuating system connected to the reactor for evacuating gases from the chamber. The deposition mask can be a metal oxide, such as silicon oxide or aluminum oxide. The metalorganic layer can be composed or iron phthalocyanine, molybedum phthalocyanine, or combinations thereof, and the carbon precursor gas can be methane that can additionally contain other gases such as argon and hydrogen. The metalorganic layer is deposited on the masked substrate, and oxidized to form metal catalyst particles of specific sizes. The mask is removed, either before or after the oxidization step. The metal catalyst particles are then exposed to the carbon precursor gases to form carbon nanotubes by the chemical vapor deposition method.

In another aspect, the invention provides a carbon nanotube structure produced by the process of depositing a metalorganic layer on a substrate having a deposition mask, oxidizing the metalorganic layer deposited on an unmasked portion of the substrate, and exposing the substrate to a carbon precursor gas at a deposition temperature to form carbon nanotube structure. The deposition mask can be a metal oxide, such as silicon oxide or aluminum oxide. The metalorganic layer can be composed or iron phthalocyanine, molybedum phthalocyanine, or combinations thereof, and the carbon precursor gas can be methane that can additionally contain other gases such as argon and hydrogen.

DETAILED DESCRIPTION

I. Definitions

Unless otherwise stated, the following terms used in this application, including the specification and claims, have the definitions given below. It must be noted that, as used in the specification and the appended claims, the singular forms "a," "an" and "the" include plural referents unless the context clearly dictates otherwise. Definition of standard chemistry terms may be found in reference works, including Carey and Sundberg (1992) "Advanced Organic Chemistry $3^{rd}$ Ed." Vols. A and B, Plenum Press, New York, and Cotton et al. (1999) "Advanced Inorganic Chemistry $6^{th}$ Ed." Wiley, New York.

The terms "single-walled carbon nanotube" or "one-dimensional carbon nanotube" are used interchangeable and refer to cylindrically shaped thin sheet of carbon atoms having a wall consisting essentially of a single layer of carbon atoms, and arranged in an hexagonal crystalline structure with a graphitic type of bonding.

The term "multi-walled carbon nanotube" as used herein refers to a nanotube composed of more than one concentric tubes.

The terms "metalorganic" or "organometallic" are used interchangeably and refer to co-ordination compounds of organic compounds and a metal, a transition metal or metal halide.

II. Overview

The present invention discloses methods, apparatus, and processes for the manufacture of carbon nanotubes and structures composed of single-wall nanotubes at preselected locations on a substrate.

Figure 1:
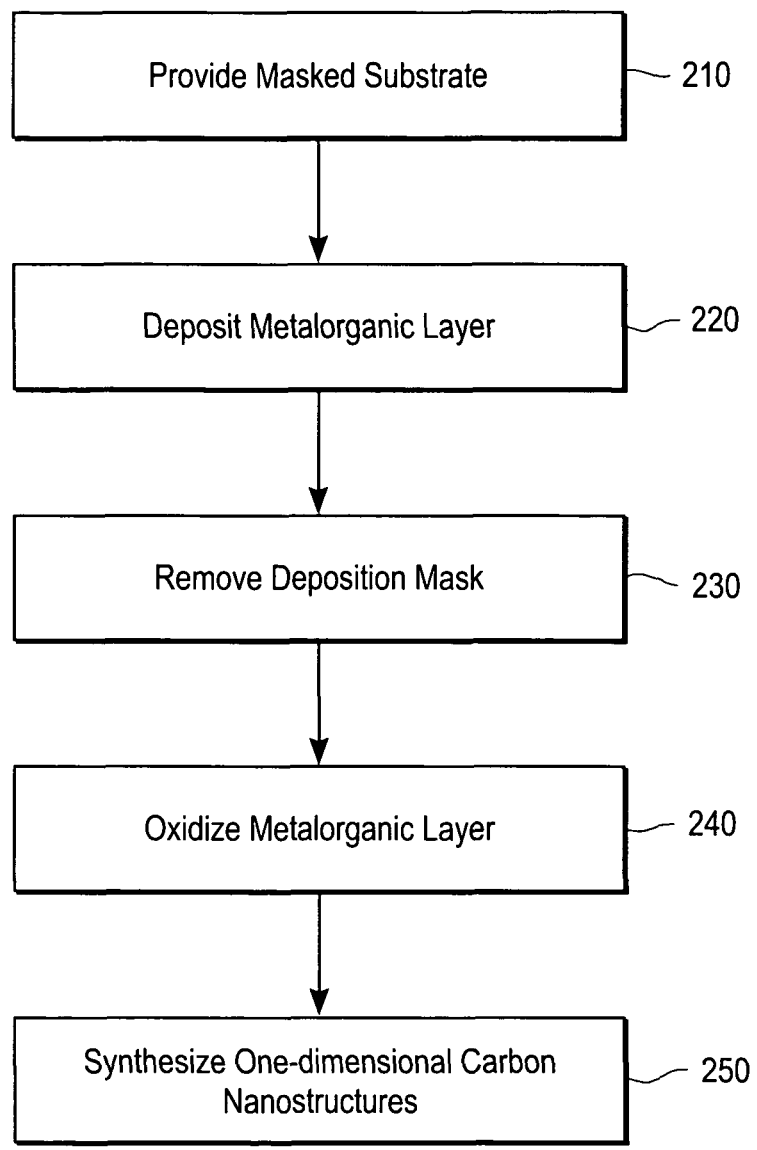
FIG. 1 provides a flow chart of a method for producing one-dimensional carbon nanostructures of the invention.

In one aspect, a substrate is provided wherein one of its surfaces has regions covered with a mask and regions that are uncovered or unmasked. The unmasked regions denote the areas targeted for the synthesis of nanotubes or nanostructures. Particles of catalysts, such as metals, are caused to be selectively deposited on the unmasked regions. Generally, a layer of metalorganic compound is deposited on the unmasked regions, and the organic component is removed, such as by oxidation, to give the catalytic metal particles at particular locations on the substrate. The substrate having catalyst particles formed on its surface is then exposed to a carbon precursor gas to give the single-walled carbon nanotubes and nanostructures. Thus, carbon nanotubes and nanostructures are produced at the locations of the catalyst particles by a chemical vapor deposition (CVD) process. A flow chart of the method is illustrated in FIG. 1. In step 210, a masked substrate is provided; in step 220, a metalorganic layer is deposited; in step 230, the deposition mask is removed; in step 240, the metalorganic layer is oxidized; and in step 250, the one-dimensional carbon nanostructures are synthesized. The size and type of carbon nanostructures formed during the chemical vapor deposition can be controlled by controlling the size of the catalyst particles that are deposited on the unmasked surface of the substrate.

In another aspect, the process of producing carbon nanotubes and nanostructures is carried out within an apparatus. The nanotubes are produced using a reaction furnace having a plurality of temperature zones. Within one of the temperature zones is placed the substrate having masked and unmasked regions. Within another temperature zone is placed an organometalic compound. The temperature and pressure within the reaction vessel is manipulated such that the metalorganic compound forms a layer of predetermined thickness on the unmasked part of the substrate by physical vapor deposition. The layer of metalorganic on the unmasked substrate is treated to provide metal particles. Preferably, the metal catalyst is comprised essentially of iron, molybdenum, cobalt, or nickel or a mixture of thereof. The metal particles are then used as catalysts for the synthesis of nanotubes and nanostructures using the CVD process. In addition, the reaction chamber can be filled with a thermal conductivity gas and an inert carrier gas. Preferably, the atmosphere contains an inert gas argon or helium and optionally some hydrogen gas, where the atmosphere is maintained at a pressure in the range of $10^{-5}$ Torr to 760 Torr, preferably in the range of $10^{-4}$ Torr to $10^{-3}$ Torr.

III. The Reaction Vessel

In one aspect of the invention, a system for producing carbon nanotubes is provided. The system comprises a reactor capable of supporting a plurality of temperature zones and having an air-tight chamber where a source of carbon precursor gas and a source of inert gases is provided, a sample holder placed within a first temperature zone, a masked substrate place within a second temperature zone, and an evacuating system connected to the reactor for evacuating gases from the chamber. The system, process and methods of the present invention are described with reference to the accompanying figures, where like reference numerals indicate identical or functionally similar elements. Also in the figures, the left most digit of each reference numeral corresponds to the figure in which the reference numeral is first used.

Figure 2:
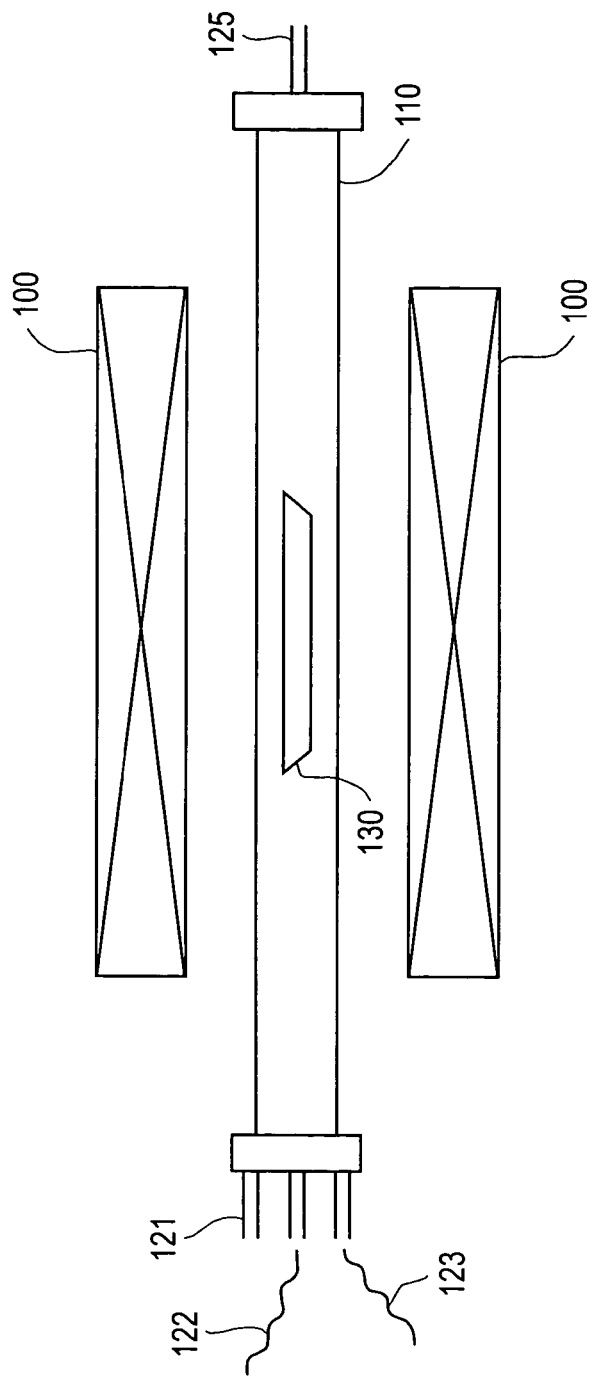
FIG. 2 depicts a horizontal apparatus suitable for producing one-dimensional carbon nanostructures of the present invention.

FIG. 2 schematically depicts a "horizontal" reaction furnace 100 that can be used to perform various embodiments of the present invention. Reaction furnace 100 can be any conventional furnace configured to allow for control over gas flows within a heated reaction chamber. For example, the Carbolite model TZF 12/65/550 is a suitable horizontal 3-zone furnace for carrying out the various aspects of the present invention.

In FIG. 2, a quartz tube 110 is placed inside of reaction furnace 100 to serve as a reaction chamber. The quartz tube serves as the reaction chamber 110 for reaction furnace 100, while the reaction furnace provides any required heat for a process. Reaction chamber 110 has gas inlet ports 121-123 and gas outlet port 125 to allow for control over the composition of the atmosphere within the quartz tube. Depending on the requirements for a given process, additional gas inlet ports can be added or unnecessary ones can be sealed off. Alternatively, the reaction chamber can be configured to allow for low pressure operation by attaching a vacuum pump (not shown) to gas outlet port 125. Other types of reaction chambers 110 suitable for use with the present invention will be apparent to those of skill in the art. During operation of reaction furnace 100, a sample holder 130 can be placed within quartz tube 110, such as a quartz boat, a quartz substrate, or another type of reaction vessel or substrate. Typically a sample holder 130 is used to facilitate introduction or removal of materials into the quartz tube or other reaction chamber 110. The material to be processed is placed on or in sample holder 130 during the gas flow and heating steps of a desired process.

Figure 3:
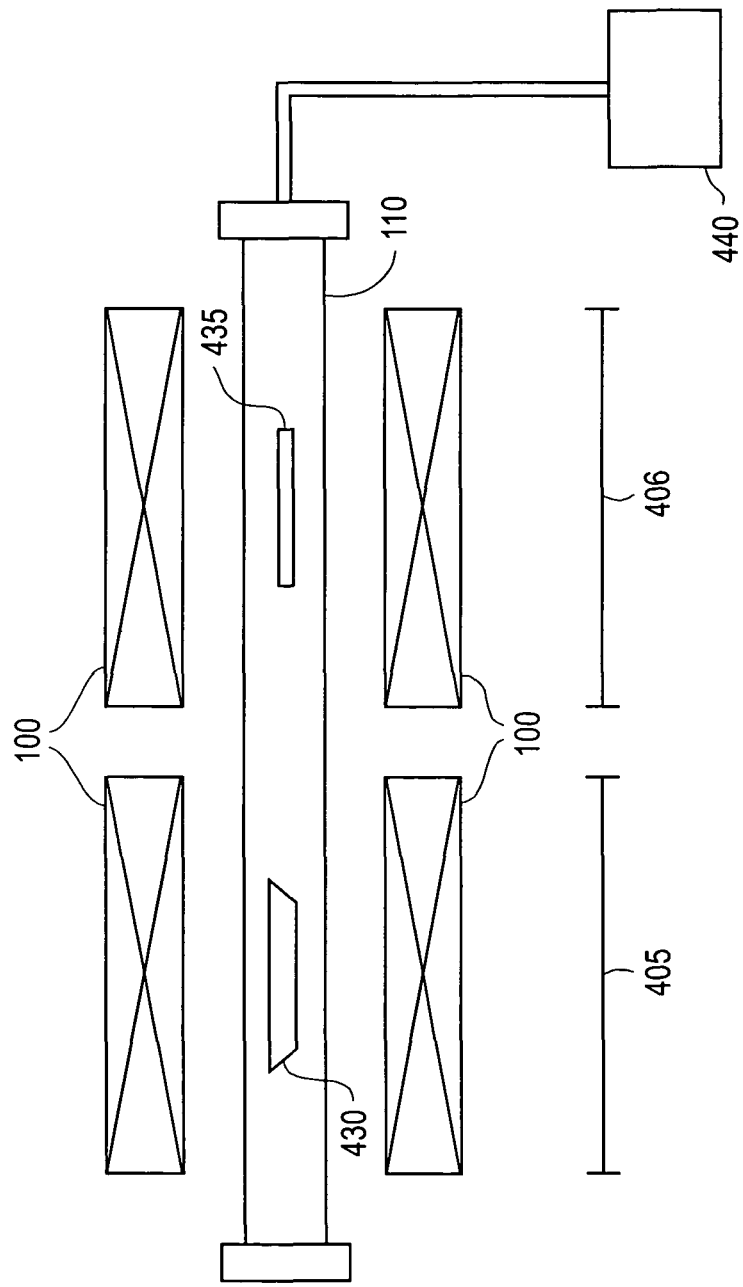
FIG. 3 depicts an apparatus having a plurality of temperature zones for producing one-dimensional carbon nanostructures of the present invention.

Another horizontal reaction vessel having a plurality of temperature zones is illustrated in FIG. 3. A reaction furnace 100 is configured for carrying out a physical vapor deposition process. As in FIG. 2, reaction furnace 100 contains a quartz tube 110 that serves as the reaction chamber. For a physical vapor deposition process, the reaction furnace is configured to have at least two temperature zones 405 and 406. Note that reaction furnace 100 is shown in separate pieces in FIG. 3 solely to highlight the presence of temperature zones 405 and 406, as all portions of reaction furnace 100 will typically be part of a conventional reaction oven capable of supporting multiple temperature zones.

In a typical operation, a sample holder 430 containing a metalorganic precursor can be placed inside reaction chamber 110 within temperature zone 405. A masked substrate 435 can be placed within temperature zone 406 of reaction chamber 110. Then, the pressure in reaction chamber 110 can be reduced by vacuum pump 440. Vacuum pump 440 can be any conventional vacuum pump. When the interior pressure of reaction chamber 110 reaches the desired pressure, the physical vapor deposition process is initiated by modulating the temperature in temperature zones 405 and 406.

The temperature in the temperature zones 405 and 406 is modulated such that a temperature gradient is created thereby facilitating the formation of a organometallic layer of defined thickness on the masked substrate 435 placed in temperature zone 406. In one aspect, all temperatures zones can be heated, with each zone having a different temperature. In another aspect, the temperature zone 405 can be heated while the other temperature zones are not heated. Thus, a temperature gradient is created because only the sample holder with the metalorganic compound is heated. The temperature in the temperature zones can be selected depending on the metalorganic compound selected, the composition of the substrate, the composition of the masking material, the thickness of the metalorganic layer desired, the volume of the reaction chamber, the gas used for thermal conductivity, and the like. Preferably, the temperature in zone 405 is selected such that the metalorganic compound placed therein sublimes. The temperature in zone 406 can be selected to allow deposition of the metal organic as a layer on the masked surface.

Vacuum pump 440 remains in operation during the physical vapor deposition process. In addition to maintaining a low pressure environment, operation of the vacuum pump can create a directional flow within reaction chamber 110 from the sample holder toward the masked substrate. As a result, metalorganic vapor that sublimates from the sample in sample holder 430 is transported from temperature zone 405 to temperature zone 406. The process thus brings the metalorganic vapor toward masked substrate 435 where the cooler temperature of temperature zone 406 allows the metalorganic compound to physically deposit on the masked substrate.

Figure 4:
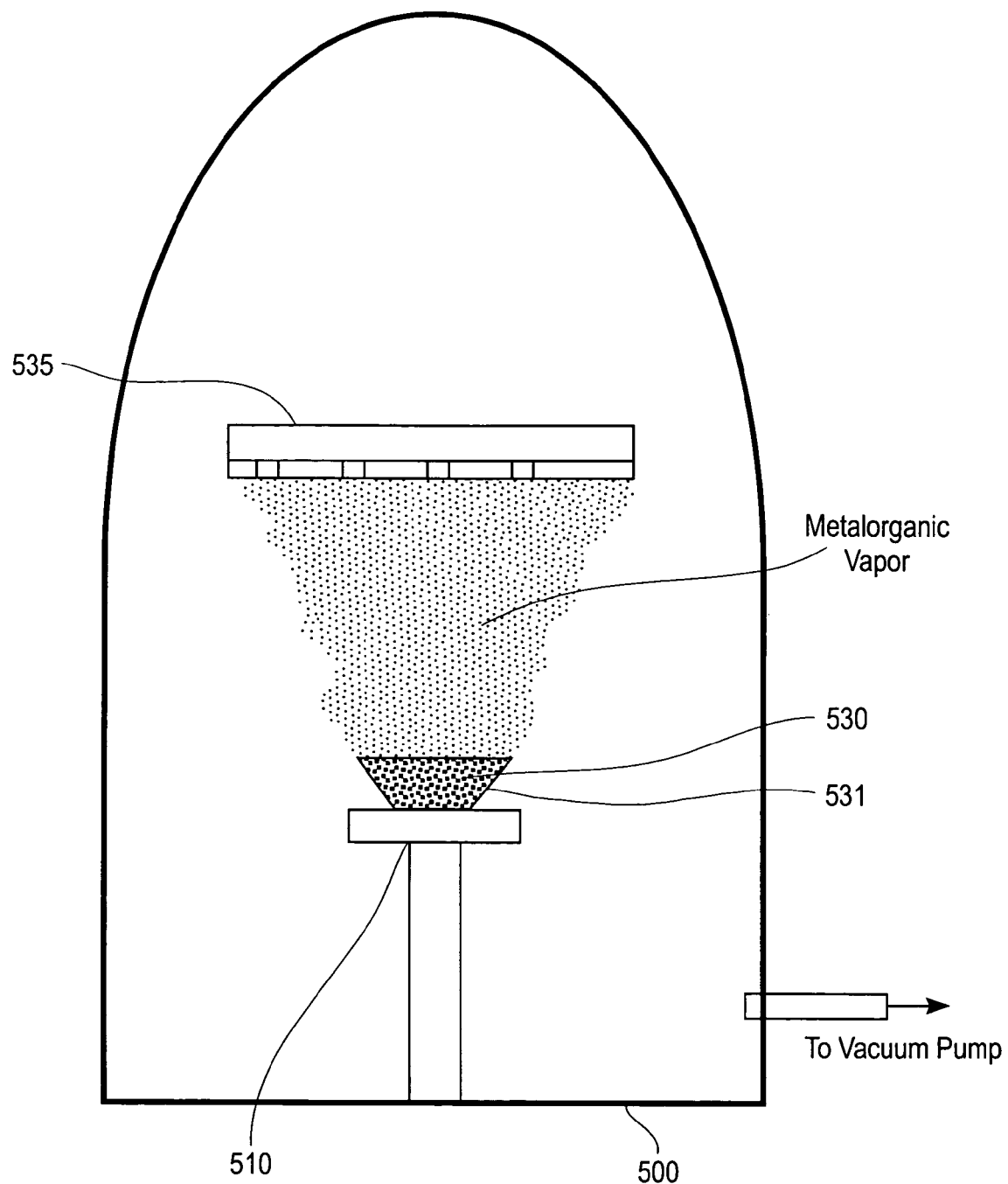
FIG. 4 illustrates a vertical apparatus suitable for carrying out the present invention.

In another aspect, the reaction vessel can have the "vertical" orientation as illustrated in FIG. 4. The reactor chamber 500 can be any conventional vertical reactor oven or chamber compatible with carrying out vacuum processing. A conventional vacuum pump (not shown) can be connected to the reaction chamber 500 for operating the reaction chamber at reduced pressures. In a typical method for carrying out a physical vapor deposition process using the system of FIG. 4, a metalorganic sample 530 is placed within reaction chamber 500, and a means for the heating the reaction vessel 531 are provided. The metalorganic sample 530 can reside in a reaction vessel 531, such as a quartz boat. For example, the reaction vessel 531 can be placed on a heater 510, such as a hot plate. Alternatively, a vertical oven can be used for reaction chamber 500, where the heater 510 for heating the reaction vessel 531 can be an integral part of the reaction chamber, such as a heating zone within the vertical oven. In this scenario, reaction vessel 531 is placed on a pedestal or other support in order to position metalorganic sample 530 in the correct heating zone of reaction chamber 500. The target of the physical deposition process, such as a masked substrate 535, is also placed in reaction chamber 500 so that the masked surface faces the metalorganic sample. The distance between metalorganic sample 530 and masked surface 535 can be selected to be about 1 cm to about 30 cm, preferably from about 3 cm to about 15 cm, more preferably about 5 cm to 10 cm, or any distance in between. Thus, 530 and 535 can be 5 cm, 6 cm, 7 cm, 8 cm, 9 cm, or 10 cm apart. Prior to beginning the physical vapor deposition, the pressure within reaction chamber 500 can be reduced using the vacuum pump. Once the desired pressure is achieved, the vacuum pump is turned off. Heater 510 can then be activated to raise the temperature of the metalorganic sample in order to cause sublimation of the metalorganic. If FePc is used as the metalorganic, sample 530 is heated to between about 480° C. and about 550° C. The metalorganic vapor produced during sublimation will impinge on masked substrate 535 leading to deposition of a metalorganic layer on exposed surfaces. Note that masked substrate 535 does not need to be heated during this physical vapor deposition process. However, depending on the configuration of the reaction chamber and the metalorganic sample used, it may be desirable to heat masked substrate 535 to a temperature between 200° C. and 300° C. in order to improve the adhesion of the metalorganic layer deposited on the masked substrate. Additionally, some heating of masked substrate 535 is likely to occur due to the close proximity of metalorganic sample 530 as well as heater 510.

In one aspect, the boat containing the metalorganic is heated, and the masked substrate is not heated. Thus, a temperature gradient is created because the boat with the metalorganic is being heated. In another aspect, both the boat and the masked substrate are heated. The substrate will typically have a lower temperature, thereby creating a temperature gradient. The substrate may be heated in order to obtain a better adhesion, control the thickness of the organometallic layer formed, and the like.

IV. The Substrate

Figure 5:
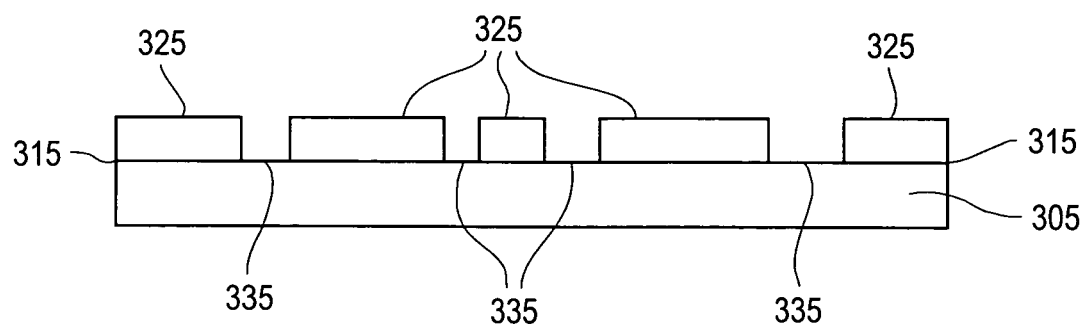
FIG. 5 schematically depicts a masked substrate for use in the methods of the present invention. A mask 325 covers the substrate 305 while target region 335 on the substrate are unmasked.

In one aspect of the invention, the single-walled carbon nanotubes can be stably associated with a solid surface of a substrate 305 shown in FIG. 5. The substrate can have dimensions and locations that results in the synthesis of nanotubes with controlled size, shape, orientation, and location, and may be fabricated from a variety of materials, including plastics, ceramics, metals, gels, membranes, glasses, beads, and the like. Preferably, the substrate is composed of a material suitable for use as a support during synthesis of carbon nanotubes using the metal growth catalysts described below. Such materials include crystalline silicon, polysilicon, silicon nitride, tungsten, magnesium, aluminum and their oxides, preferably silicon oxide, aluminum oxide, and magnesium oxide. For example, deposition targets 335 can be exposed areas of oxidized silicon on the surface of a silicon wafer. Other areas of substrate 305 may be composed of any suitable structural material.

In one aspect of the invention, the substrate is treated to provide specific location for the growth of the nanotubes and nanostructures. Such treatment includes masking the surface of the substrate, and having unmasked regions, electrochemical (EC) and photoelectrochemical (PEC) etching to fabricate an individual hole or structure at a specific location on a substrate, and the like. Referring to FIG. 5, the substrate 305 preferably has a top surface 315 and a surface opposite. The top surface can have portions that are covered with a removable mask 325 and portions that are not covered or are unmasked 335. The uncovered areas 335 represent the areas targeted for the synthesis of carbon nanotubes. The metal catalyst particles are caused to be located in the uncovered areas by the process of physical vapor deposition, and, therefore, the uncovered areas will be referred to as deposition targets 335.

The deposition targets 335 are preferably composed of a material suitable for use as a support during synthesis of carbon nanotubes using the metal growth catalysts described below. Such materials include silicon oxide, aluminum oxide, and magnesium oxide. For example, deposition targets 335 can be exposed areas of oxidized silicon.

The mask 325 can be composed of any material provided that the material can be removed if desired. The mask is therefore made of a material that can be relatively easily removed, such as by physical removal, dissolving in water or in a solvent, by chemically or electrochemically etching, or by vaporizing through heating. Thus, the mask materials include water-soluble or solvent-soluble salts such as sodium chloride, silver chloride, potassium nitrate, copper sulfate, and indium chloride, or soluble organic materials such as sugar and glucose. The mask material can also be a chemically etchable metal or alloy such as Cu, Ni, Fe, Co, Mo, V, Al, Zn, In, Ag, Cu—Ni alloy, Ni—Fe alloy and others, or base-dissolvable metals such as Al can also be used. The mask can be made of a soluable polymer such as polyvinyl alcohol, polyvinyl acetate, polyacrylamide, acrylonitrile-butadiene-styrene. The removable mask, alternatively, can be a volatile (evaporable) material such as PMMA polymer. These materials can be dissolved in an acid such as hydrochloric acid, aqua regia, or nitric acid, or can be dissolved away in a base solution such as sodium hydroxide or ammonia. The removeable layer or mask may also be a vaporizable material such as Zn which can be decomposed or burned away by heat. The mask can be added by physically placing it on the substrate, by chemical deposition such as electroplating or electroless plating, by physical vapor deposition such as sputtering, evaporation, laser ablation, ion beam deposition, or by chemical vapor decomposition.

Thus, in one aspect, the mask can be an aluminum foil. The aluminum foil can have structures cut or etched onto it. The structures preferably expose the deposition targets 335 on the substrate, and denote the location, size, and/or the orientation of the nanotubes and nanostructures to be synthesized. For example, the structures can be holes at specific locations to give a nanotube at a particular location, V-shaped groves, Y-shaped groves, circles, trenches, and the like, to provide the nanostructures at the locations desired.

In another aspect, the mask 325 can be a metal oxide, such as quartz or sapphire. The metal oxide can be stenciled or patterned into the structures desired, such as holes, circles, and trenches. In another aspect, the deposition targets can be formed by placing an impurity, local defect, or stress on the substrate or the mask. The impurity, local defect, or stress can be placed by x-ray lithography, deep UV lithography, scanning probe lithography, electron bean lithography, ion beam lithography, optical lithography, electrochemical deposition, chemical deposition, electro-oxidation, electroplating, sputtering, thermal diffusion and evaporation, physical vapor deposition, sol-gel deposition, or chemical vapor deposition. In yet another aspect, the location and number of carbon nanotubes can be controlled by etching at desired location and not etching at all or etching at different rates the areas surrounding the desired area.

The method of nanotube fabrication of the present invention also accommodates use of lithographic technologies, such as optical and scanning probe lithography, to fabricate a hole or a structure at specific location on the substrate or the mask. Existing optical and scanning probe lithographic technologies can be used to fabricate holes with controllable diameter, at precise locations on a substrate (controllable location) or the mask, and with controllable depth. These methods include x-ray lithography, deep UV lithography, scanning probe lithography, electron beam lithography, ion beam lithography, and optical lithography. Scanning Probe Lithography can be used to fabricate structures, including the holes, with precise control over the of the location and the dimension of the hole. Optical lithography is a technology capable of mass production of structures. Control of the location and dimension of structures, such as the holes, can be performed with precise control.

V. The Catalyst

Before a carbon nanotube can be grown at the unmasked areas 335, the metallic catalyst must be deposited within it. The function of the metallic catalyst in the carbon nanotube growth process is to decompose the carbon precursors and aid the deposition of ordered carbon. The metal catalyst can be selected from a Group V metal, such as vanadium, a Group VI metal including Cr, W, Mo, and mixtures thereof, VII metal, such as, Mn, Group VIII metal including Co, Ni, Ru, Rh, Pd, Ir, Pt, and mixtures thereof, or the lanthamides, such as cerium. The oxides of the material used for substrate may also be used as catalysts for growing carbon nanotubes. Preferably, the metal catalyst is iron, molybedum, or a mixture thereof.

In one aspect, the metal catalyst is complexed to an organic moiety to give an metalorganic precursor compound. Thus, the metals selected from the list above can be complexed with, for example phtalocyanince, porphorin, cyclopentyl, and the like to give the precursor compound. Generally, the metalorganic compound is selected such that it has properties such as a high vapor pressure, high purity, high deposition rate, easy handling, nontoxicity, low cost and a suitable deposition temperature. A variety of metalorganic precursors can be used to form the metalorganic precursor layer. One suitable metalorganic precursor material is iron phthalocyanine (FePe). FePc is a solid at room temperature. A vapor of FePc can be created by heating a FePc sample to a sufficient temperature to cause sublimation of the FePc. Heating an FePc sample to a temperature between about 480° C. and about 520° C. generates a suitable amount of FePc vapor for a physical deposition process. Molybdenum phthalocyanine (MoPc) or a mixture of FePc and MoPc can also be used as the metalorganic precursor. Preferably, any metalorganic compound containing iron or molybdenum that is compatible with use in a physical vapor deposition process can be used. Examples of such compounds include iron porphyrins.

In one aspect, the process of the invention is carried out by vaporizing one or more organometallic precursor compounds, transporting, using a carrier gas, the vaporized precursor(s) to the surface of the masked substrate and forming a thin film on the surface of the substrate through a chemical reaction. The physical vapor deposition described above is advantageous in that it can be carried out at a relatively low temperature, the constitution and deposition rate of the thin film can be readily controlled by changing the amounts of the source materials and the carrier gas, and the final thin film has good uniformity without causing any damage on the surface of the substrate.

During the physical vapor deposition process, a layer of the metalorganic precursor will form on all exposed surfaces of the substrate. Thus, a metalorganic layer will be formed on top of the mask 325 as well as on top of deposition targets 335 (the exposed portions of top surface 315). The thickness of the deposited metalorganic layer is one factor that influences the resulting size and shape of the carbon nanostructures produced when using the present invention. Typical thicknesses for the metalorganic layer range from about 1 micron to about 30 microns. However, physical vapor deposition can be used to create metalorganic layers of up to 50 microns or greater if such layers are desired.

After depositing the metalorganic precursor layer, the mask is removed from the substrate. The method of removing the mask depends on the type of masking layer used. For example, if the mask is composed of a layer of aluminum foil or thin plastic, the mask can be lifted off of the underlying substrate. In such an example, the physical removal of the mask also removes the portions of the metalorganic layer deposited on the mask. Thus, the metalorganic layer will remain only in the deposition targets.

After removal of the mask, the portions of the metalorganic layer remaining on the substrate are oxidized or pyrolyzed. Oxidizing or pyrolyzing the metalorganic layer causes oxidation of the organic components of the metalorganic compound. The oxidation reaction products are typically volatile, leading to their removal from the substrate and leaving behind the metal from the metalorganic layer. The metal left behind on the substrate will coalesce into particles or clusters of particles during oxidation. These metal or metal oxide particles will serve as the growth catalyst during synthesis of carbon nanotubes. Because the metalorganic layer is only present at deposition targets (the unmasked areas during deposition of the metalorganic layer), the metal growth catalyst particles form in on the deposition targets as well.

One method for oxidizing the metalorganic layer is to heat the substrate to a temperature between about 450° C. and about 500° C. in the presence of an oxygenated atmosphere. For example, the reaction oven 100 depicted in FIG. 2 can be configured to carry out this type of process. The substrate with the metalorganic layer is placed in reaction chamber 110. Gas inlet 125 is attached to a source of ultra-high purity oxygen (UHP $O_2$). The temperature of the oven 100 is then raised to 500° C. while flowing UHP $O_2$. These processing conditions are maintained for between 2 to 4 hours in order to oxidize the organic components in the metalorganic layer, leaving behind metal growth catalyst particles on the substrate. Note that the oxidizing environment used in this process for forming the metal growth catalyst particles may partially or completely oxidize the metal growth catalyst particles. Thus, those skilled in the art will understand that the metal growth catalyst particles can be composed of either metal or metal oxide.

In another aspect, oxidizing the metalorganic layer can be performed before removal of the deposition mask. Deposition masks composed of materials such as sapphire are relatively inert when exposed to the reaction conditions used to oxidize the metalorganic layer. When such a deposition mask is used, the metalorganic layer can be oxidized before the mask is removed. Thus, oxidizing the metalorganic layer results in formation of metal particles on both the mask and the exposed areas of the substrate. The metal particles on the mask are then removed when the deposition mask is removed from the substrate. As a result, the desired result of selectively placing the metal particles for use as growth catalyst only in the areas where the substrate was exposed through the deposition can be achieved.

In another aspect, the selected catalyst metal is not complexed, but can be deposited on the unmasked region 335 directly. Existing methods known to those skilled in the art can be used to deposit a metallic catalyst material evenly around the unmasked areas. Existing catalyst deposition methods include electrochemical deposition, chemical deposition, electro-oxidation, electroplating, sputtering, thermal diffusion and evaporation, physical vapor deposition, spraying, painting, printing, emersing, sol-gel deposition, and chemical vapor deposition. Typically, the metal to be deposited may be evaporated over flat substrates such as quartz, glass, silicon, and oxidized silicon surfaces support such as silica ($SiO_2$), alumina ($Al_2O_3$), MgO, Mg(Al)O (aluminum-stabilized magnesium oxide), $ZrO_2$, molecular sieve zeolites, or other supports known in the art.

Once the metal growth catalyst particles are formed on the surface of the substrate, the metal oxide particles can be used as a growth catalyst for synthesis of carbon nanotubes, nanofibers, and other one-dimensional carbon nanostructures by a chemical vapor deposition (CVD) process.

VI. Carbon Precursors

The carbon nanotubes can be synthesized using carbon precursors, such as carbon containing gases. In general, any carbon containing gas that does not pyrolize at temperatures up to 800° C. to 1000° C. can be used. Examples of suitable carbon-containing gases include carbon monoxide, aliphatic hydrocarbons, both saturated and unsaturated, such as methane, ethane, propane, butane, pentane, hexane, ethylene, acetylene and propylene; oxygenated hydrocarbons such as acetone, and methanol; aromatic hydrocarbons such as benzene, toluene, and naphthalene; and mixtures of the above, for example carbon monoxide and methane. In general, the use of acetylene promotes formation of multi-walled carbon nanotubes, while CO and methane are preferred feed gases for formation of single-walled carbon nanotubes. The carbon-containing gas may optionally be mixed with a diluent gas such as hydrogen, helium, argon, neon, krypton and xenon or a mixture thereof.

The specific reaction temperature used depends on the type of catalyst and the type of precursor. Energy balance equations for the respective chemical reactions can be used to analytically determine the optimum CVD reaction temperature to grow carbon nanotubes. This determines the required reaction temperature ranges. The optimum reaction temperature also depends on the flow rates of the selected precursor and the catalyst. In general, the method requires CVD reaction temperatures ranging from 300° C. to 900° C., more preferably reaction temperatures ranging from 400° C. to 600° C.

The size and type of carbon nanostructures formed during the CVD process depends in part on the thickness of the metalorganic layer deposited on each deposition target. During pyrolysis of the metalorganic layer, the metal from the metalorganic layer accumulates on the surface of the substrate. For a given area on the substrate, increasing the thickness of the metalorganic layer will increase the amount of metal that accumulates in that area during oxidation of the metalorganic. It is believed that this influences the size of the metal particles formed on the substrate in two ways. First, thicker metalorganic layers tend to produce larger metal growth catalyst particles. Second, thicker metalorganic layers also tend to produce clusters of metal growth catalyst particles.

Without being bound by any particular theory, it is believed that formation of larger metal growth catalyst particles on the surface leads to synthesis of larger diameter nanostructures. For example, pyrolysis of a 1 micron layer of FePc results in formation of metal growth catalyst particles that can produce an isolated single-wall carbon nanotube that is 10 microns long and 1 nm in diameter. Under similar conditions, pyrolysis of a 5-10 micron layers of FePc produces metal growth catalyst particles that can produce an isolated carbon nanotube with a diameter of 35 nm. Note that this carbon nanotube is not a single-wall nanotube. With a still thicker FePc layer of 30 microns, pyrolysis of the metalorganic layer results in metal growth catalyst particles that can produce an isolated solid carbon nanofiber of roughly 1 micron in diameter.

The carbon nanotubes and nanostructures produced by the methods and processes described above can be used in applications that include Field Emission Devices, Memory devices (high-density memory arrays, memory logic switching arrays), Nano-MEMs, AFM imaging probes, distributed diagnostics sensors, and strain sensors. Other key applications include: thermal control materials, super strength and light weight reinforcement and nanocomposites, EMI shielding materials, catalytic support, gas storage materials, high surface area electrodes, and light weight conductor cable and wires, and the like.

EXAMPLES

Below are examples of specific embodiments for carrying out the present invention. The examples are offered for illustrative purposes only, and are not intended to limit the scope of the present invention in any way. Efforts have been made to ensure accuracy with respect to numbers used (e.g., amounts, temperatures, etc.), but some experimental error and deviation should, of course, be allowed for.

Example 1

Purification of the Metalorganic Sample

It may be desirable to purify the metalorganic precursor prior to deposition on the masked substrate. For example, FePc samples often contain up to 20% by weight of other materials. This contamination can lead to problems during a physical vapor deposition process, such as variations in the sublimation rate and contamination of the resulting physically deposited layer which may adversely the repeatability and reliability of the CVD processes. In order to reduce the impact of such contamination, the metalorganic precursor sample can be purified prior to use by the process of physical vapor deposition. During purification, a metalorganic sample to be purified is placed in temperature zone 405 of the reactor shown in FIG. 3. A deposition target for collecting purified metalorganic material is placed in temperature zone 406. However, this is not necessary, as the physical vapor deposition process will result in deposition of metalorganic material on all exposed surfaces in temperature zone 406. The purification is carried out under the same type of conditions used for deposition on a masked substrate. For example, to purify a sample of FePc, the temperature in temperature zone 405 is set to between about 480° C. and about 520° C., while the temperature in temperature zone 406 is set to between about 200° C. and about 300° C. The physical vapor deposition process for purification is carried out at a pressure of $10^{-4}$ Torr. The vacuum pump not only maintains the pressure within the reaction chamber 110, but also creates a flow within reaction chamber 110 toward the deposition target. The process conditions are maintained for roughly 10 hours, or until all of the initial sample to be purified has undergone sublimation. After the purification process, the purified metalorganic material is collected from all exposed surfaces in temperature zone 406, such as any substrates placed in temperature zone 406 and the walls of reaction chamber 110. If desired, a metalorganic sample can be purified multiple times to achieve still higher crystallinity and purity.

Example 2

Synthesis of Carbon Nanotubes

The Carbolite model TZF 12/65/550 having a horizontal 3-zone furnace is used. A silicon oxide rectangle having length, width, and depth of 4 cc, 4 cm, and 0.5 cm, respectively, is selected as the substrate. One of the surfaces of the substrate is coved with an aluminum foil, and holes of approximately 10 nm diameter are evenly placed on the aluminum foil. In one temperature zone is placed a quartz sample holder. On the sample holder is placed 0.5 g of the metalorganic precursor compound iron phthalocyanine ($FeC_{32}H_{16}N_8$). In another temperature zone is placed the masked substrate prepared above. The pressure in reaction chamber is reduced to approximately $10^{-4}$ Torr by vacuum pump. When the interior pressure of reaction chamber reaches approximately $10^{-4}$ Torr, the physical vapor deposition process is initiated by increasing the temperature within the furnace. The temperature of the zone containing FePc is increased to a temperature of between about 480° C. and about 520° C. The temperature zone containing the substrate is similarly heated to between about 200° C. and about 300° C. These temperatures are then maintained until a metalorganic layer of a thickness of about 2 microns forms on the masked substrate. After depositing the metalorganic precursor layer, the aluminum foil mask is lifted from the substrate. The furnace is attached to a source of ultra-high purity oxygen (UHP $O_2$). The temperature of the oven is then raised to 500° C. while flowing 1000 standard cubic centimeters per minute of UHP $O_2$. These processing conditions are maintained for between 2 to 4 hours in order to oxidize the organic components in the metalorganic layer, leaving behind metal growth catalyst particles on the substrate. The substrate with the metal oxide particles thus obtained are not removed from the reaction chamber, but gas inlets are used to provide flows of hydrogen ($H_2$), the carbon precursor gas methane ($CH_4$), and the inert carrier gas argon (Ar). The temperature in the reactive oven is then raised to about 700° C. while exposing the substrate to 350 sccm of $H_2$, 450 sccm of Ar, and 12 sccm of $CH_4$. The temperature and gas flows are maintained for between about 15 to 60 minutes in order to form carbon nanostructures.

While the invention has been particularly shown and described with reference to a preferred embodiment and various alternate embodiments, it will be understood by persons skilled in the relevant art that various changes in form and details can be made therein without departing from the spirit and scope of the invention. All printed patents and publications referred to in this application are hereby incorporated herein in their entirety by this reference.

We claim:

1. A method for synthesizing single wall carbon nanotubes, the method comprising the steps of:
    providing a substrate having a deposition mask;
    depositing a bimetallic or trimetallic metalorganic layer on the substrate, wherein at least a portion of the bimetallic or trimetallic metalorganic layer is deposited on an unmasked portion of the substrate, and wherein the bimetallic or trimetallic metalorganic layer comprises an organic portion and an inorganic portion, and wherein the bimetallic or trimetallic metalorganic layer has a thickness of 1 micron;
    removing the deposition mask from the substrate;
    exposing said portion of the bimetallic or trimetallic metalorganic layer to air;
    pyrolyzing the organic portion of said portion of the bimetallic or trimetallic metalorganic layer by exposing said portion to air and heating said portion to a temperature of between 450° C. and 500° C. for between 2 to 4 hours to form a growth catalyst on the substrate; and
    exposing the substrate to a carbon precursor gas at a deposition temperature to form single wall carbon nanotubes.

2. The method of claim 1, wherein the bimetallic or trimetallic metalorganic layer comprises a metalorganic selected from: iron phthalocyanine, molybdenum phthalocyanine, nickel phthalocyanine, copper phthalocyanine, or a combination thereof.

3. The method of claim 1, wherein the bimetallic or trimetallic metalorganic layer is deposited by a physical vapor deposition process.

4. The method of claim 1, wherein the deposition mask comprises a metal oxide.

5. The method of claim 1, wherein the deposition mask comprises a substance selected from silicon oxide or aluminum oxide.

6. The method of claim 1, wherein the unmasked portion of the substrate has a top surface comprising a metal oxide.

7. The method of claim 6, wherein the metal oxide is selected from the group consisting of silicon oxide, aluminum oxide, and magnesium oxide.

8. The method of claim 1, wherein the growth catalyst comprises metal growth catalyst particles.

9. The method of claim 1, wherein the carbon precursor gas comprises methane.

10. The method of claim 1, wherein exposing the substrate to a carbon precursor gas comprises exposing the substrate to an atmosphere comprising methane, argon, and hydrogen.

11. The method of claim 10, wherein the substrate is exposed to the carbon precursor gas for between 15 minutes and 60 minutes.

12. The method of claim 1, wherein the deposition temperature is 700° C.

13. The method of claim 1, wherein the bimetallic or trimetallic metalorganic layer is produced by deposition of a metalorganic substance and the metalorganic substance is purified prior to deposition of the bimetallic or trimetallic metalorganic layer.

14. The method of claim 1, wherein the exposing said portion of the bimetallic or trimetallic metalorganic layer to air is performed prior to removing the deposition mask from the substrate.

* * * * *